United States Patent [19]
Matta et al.

[11] Patent Number: 5,910,747
[45] Date of Patent: Jun. 8, 1999

[54] METHOD FOR OPTIMIZATION OF MULTI-LEVEL INTERCONNECT RC DELAY

[75] Inventors: Ashwin I. Matta; Larry A. Woodrum; Rajiv Hattangadi, all of Austin, Tex.

[73] Assignee: Advanced Micro Devices, Inc.

[21] Appl. No.: 08/747,394

[22] Filed: Nov. 12, 1996

[51] Int. Cl.⁶ .................................................. H03K 17/62
[52] U.S. Cl. ........................................... 327/415; 327/416
[58] Field of Search ................................. 327/415–418, 327/400

[56] References Cited

U.S. PATENT DOCUMENTS 5,614,844   3/1997   Sasaki et al. ............................... 326/84

FOREIGN PATENT DOCUMENTS 1383476   3/1988   U.S.S.R. .................................. 327/415

OTHER PUBLICATIONS

Bakoglu, H.B. & J.D. Meindl, "Optimal Interconnection Circuits for VLSI," IEEE Trans. On Electron Devices, vol. ED–32, No. 5, May 1985, pp. 903–909.

Primary Examiner—Kenneth B. Wells
Attorney, Agent, or Firm—Kevin L. Daffer; Mark L. Berrier; Conley, Rose & Tayon

[57] ABSTRACT

A method is herein provided for placing drivers and repeaters along the interconnect so as to optimize interconnection propagation delay with respect to area and time constraints. The method provided optimizes the propagation delay and simplifies the propagation delay determination by first using drivers to divide an interconnect into forkless branches, then linearizing the delay of each branch by placing repeaters along the length of the branches.

4 Claims, 6 Drawing Sheets

METHOD FOR OPTIMIZATION OF MULTI-LEVEL INTERCONNECT RC DELAY

BACKGROUND OF THE INVENTION

1. Field of the Invention

This invention relates to the field of integrated chip design, and in particular to methods for solving the problem of increased interconnect delays resulting from reduced chip geometry.

2. Description of the Related Art

Interconnect propagation delays are a serious issue for next generation microprocessors. Interconnect delays do not scale with technology. Rather, the delays actually increase with shrinking geometries due to fringing effects. The delays are playing an increasingly significant role in the determination of overall system performance. In many cases the propagation delay plays a critical role in the chip design cycle. Consequently more resources are being dedicated to the determination and minimization of interconnect delay.

The determination of interconnect propagation delay is based on interconnect resistivity, capacitive coupling, and geometry. Since the resistivity varies with the layer of the interconnect (i.e. polysilicon, metal I, metal II, etc.), the capacitive coupling is determined by proximity to other interconnects, and geometry exerts a non-linear effect on propagation delay, the determination of delay is a problem of significant complexity. When it is taken into account that many millions of interconnects must be evaluated, the problem becomes a significant obstacle to next-generation microprocessor design.

It is therefore desirable that a method be found for simplifying the determination of interconnect propagation delay. It is further desirable that the propagation delay be optimized in order to maximize microprocessor performance.

SUMMARY OF THE INVENTION

The problems outlined above are in large part solved by a method for optimizing interconnect propagation delay with respect to area and time constraints. A method is herein provided for placing drivers and repeaters along the interconnect so as to optimize interconnection propagation delay. The method provided simplifies the propagation delay determination by first using drivers to divide an interconnect into forkless branches, then linearizing the delay of each branch by placing repeaters along the length of the branches.

Broadly speaking, the present invention contemplates a method in which a driver is used to isolate the loading of a fan out branch from a parent interconnect. The present invention further contemplates a method in which repeaters are placed in unbalancing portions of the interconnect to reduce the propagation delay along those portions.

BRIEF DESCRIPTION OF THE DRAWINGS

Other objects and advantages of the invention will become apparent upon reading the following detailed description and upon reference to the accompanying drawings in which.

Figure 1:
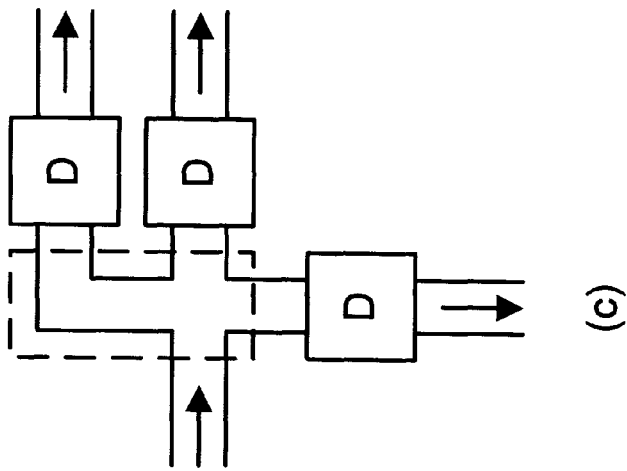
FIG. 1 illustrates exemplary placements of drivers to divide interconnect networks into forkless branches.
Figure 1:
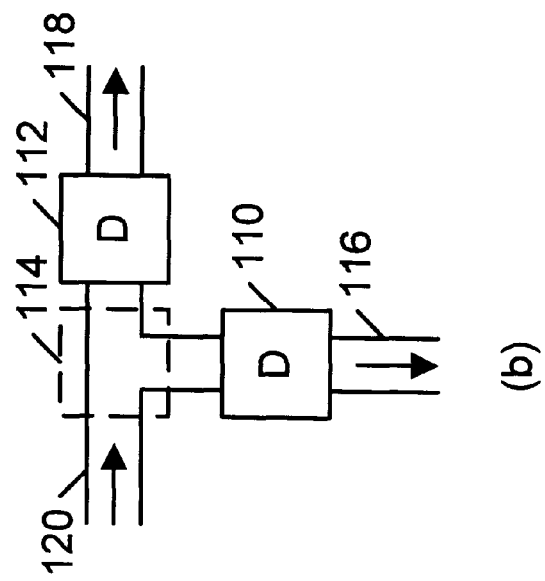
Figure 1:
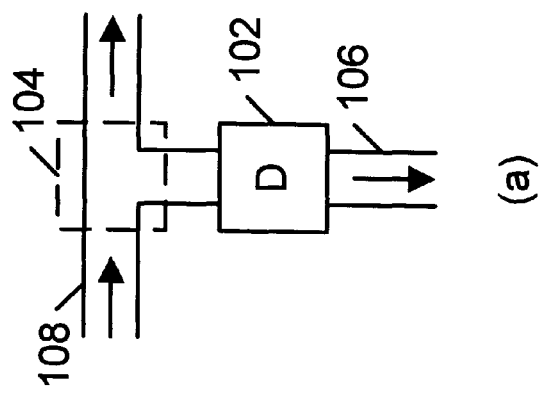

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

An interconnect is an electrical connection between nodes in an integrated circuit. It is typically a layer of semiconductor or metal deposited during processing of a silicon wafer in the construction of an integrated circuit. Due to the materials and small feature sizes, typical interconnects have significant resistivity. Also, due to the proximity of other interconnects and electronic devices, typical interconnects have a significant capacitance. A significant fraction of the many millions of interconnects in a typical microprocessor are of sufficient size that the resistive and capacitive characteristics cause a serious impact on the propagation time of an electrical signal carried by the interconnects. For example, nearly all of the interconnects that are designed at the floor plan level of the chip design process are extensive enough to have significant resistive-capacitive (RC) values. In effect, the propagation delay is due to the need for an input signal driver to charge an RC circuit formed by the interconnect. The charging time (propagation delay) is proportional to the square of the length of the interconnect, and terms must be added to account for branches and vias. An expression for the charging time becomes even more complex when more than one material is involved, i.e. when the interconnect comprises conduction paths on multiple levels.

To speed up the charging of the interconnect, and at the same time simplify the determination of charging time, additional drivers are placed throughout the interconnect. Drivers are cascaded inverting amplifiers. The first stage of a driver is chosen to be small to minimize the capacitive load on the input. The second stage of a driver is chosen to be about 2.7 times larger to provide the current for driving the output line while keeping the response time low.

Turning now to FIG. 1, several junction topologies are shown. In each of these topologies, one or more drivers are placed at a junction to isolate the loading effects of branches from the parent interconnect. In FIG. 1a, a driver 102 is placed at a junction 104 to isolate a branch 106 from a parent interconnect 108. This has the effect of eliminating the term associated with the charging of branch 106 from the charging time of the interconnect, thereby reducing the overall charging time. In FIG. 1b, drivers 110 and 112 are placed at junction 114 to isolate branches 116 and 118 from parent interconnect 120. The additional driver serves to further reduce the charging time. As indicated by FIG. 1c, progressively more complicated junction topologies can be similarly treated by placing drivers at the junction to isolate the loading effects of branches, and thereby reduce the overall charging time. The drivers are placed in a recursive fashion, so that any sub-branches diverging from primary branches are also isolated, any sub-sub-branches are also isolated, etc. Consequently, through use of the drivers, an interconnect is divided into unforking segments (hereafter generically referred to as unforking branches). The overall propagation delay can then be approximated by the sum of the charging times of the unforking branches which the signal must traverse. The charging times of each of the unforking branches remains proportional to the square of the length.

To further speed up the charging of the interconnect, and further simplify the determination of charging time, repeaters are placed throughout the interconnect. Repeaters each consist of a single inverting amplifier which serves to provide additional drive current for long interconnect segments.

Figure 2:
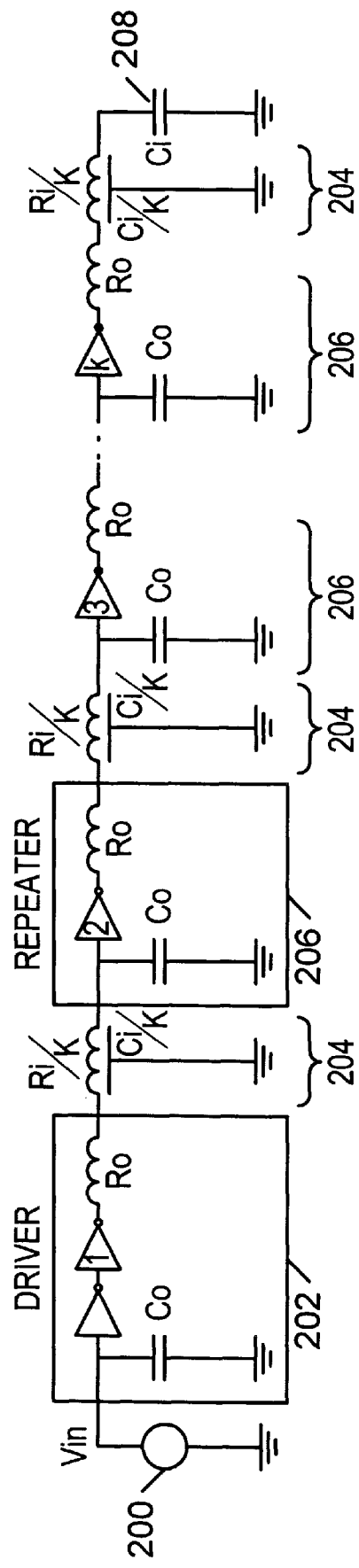
FIG. 2 illustrates a method for optimizing the propagation delay of a fixed length interconnect.

Turning now to FIG. 2, an equivalent circuit schematic is provided for each of the unforking branches having an input signal 200, a driver 202, a distributed resistance $R_i$ and a distributed capacitance $C_i$ evenly split into k segments 204 by (k−1) repeaters 206, and a load capacitance 208. The final stage of driver 202 is of the same size as repeater 206. The time delay of the entire segment can be found by adding the delays caused by each of the segments in conjunction with the repeaters. The RC time delay of one repeater and one segment is $$T_1 = \left(R_o + \frac{R_i}{k}\right)\left(C_o + \frac{C_i}{k}\right)$$

Ignoring the delay of the first stage of driver 202 (the delay of the first stage is accounted for separately using characterization) and treating the second stage of driver 202 as a repeater, the RC time delay of the circuit is $$T_k = k\left(R_o + \frac{R_i}{k}\right)\left(C_o + \frac{C_i}{k}\right),$$

where $C_o$ is the input capacitance and $R_o$ is the ON resistance of each repeater 206. The number of repeaters which gives the minimum time delay can be found by taking the derivative with respect to k and setting it equal to zero. The result is $$k = \sqrt{\frac{R_i C_i}{R_o C_o}}.$$

Substituting this value into the original equation provides the minimum time delay $$T_{min} = \left(\sqrt{R_o C_i} + \sqrt{R_i C_o}\right)^2.$$

Typically, $C_i$ is three orders of magnitude larger than $C_o$, while $R_i$ is approximately the same size as $R_o$. Consequently, $T_{min}$ is approximately equal to $R_o C_i$, and is relatively independent of the resistive component of the interconnect. Note that since $C_i$ is a linear function of the length of the segment, and $R_o$ is independent of the length of the segment, the resulting minimum time is a linear function of the length of the segment. Hence the use of repeaters has the added benefit of making the propagation delay of the unforking branches a linear function of their length. If an unforking branch comprises segments of different metal layers, the number of repeaters for each layer can be computed separately for each layer and added together to get a total number of repeaters. The total number of repeaters would then be placed evenly along the length of the unforking branch.

Figure 3:
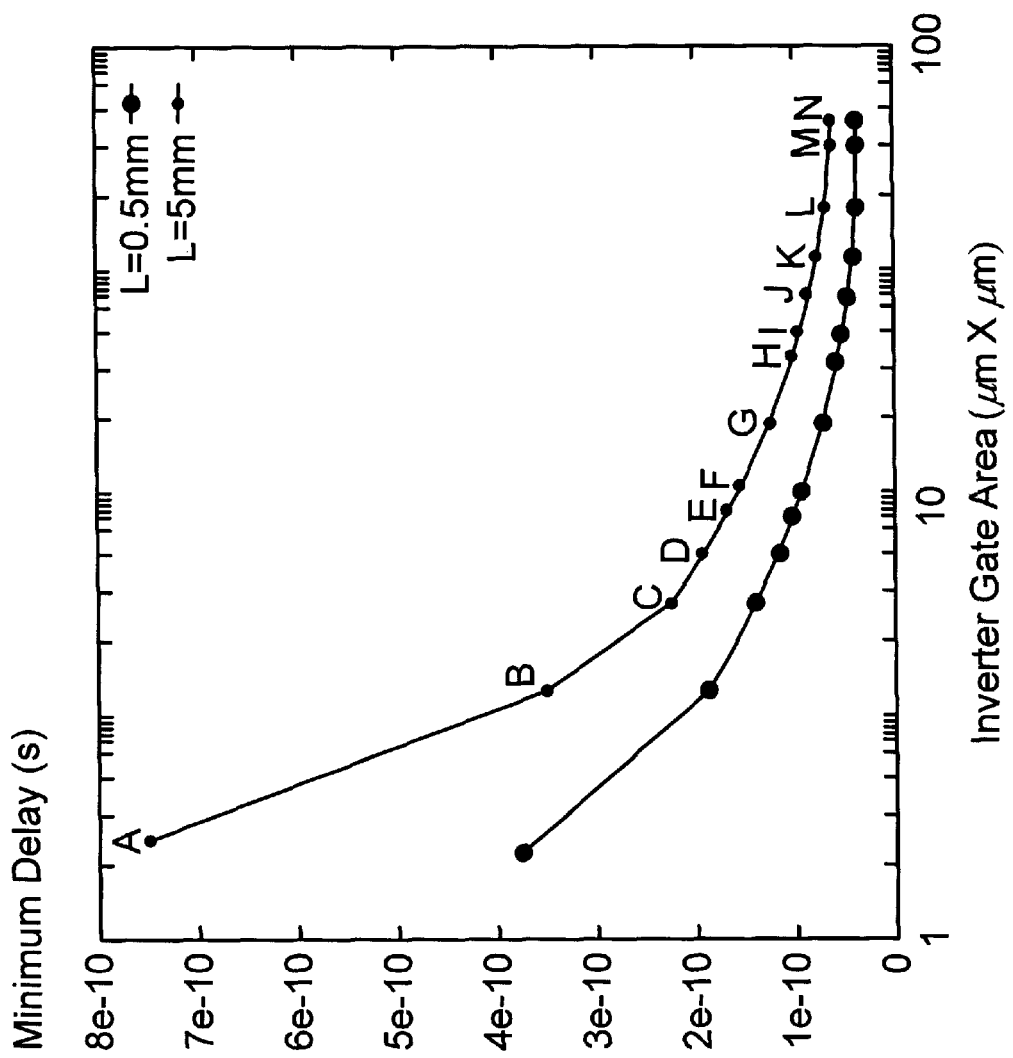
FIG. 3 is a graph depicting a relationship between repeater size and interconnect propagation delay.

Turning now to FIG. 3, a graph is provided which depicts the relationship between repeater size and minimum propagation delay for two interconnection lengths. Increasing the gate area of the repeater reduces the repeater's ON resistance, thereby providing reduced propagation delays. If the graph were to be extended further, it would be observed that for very large repeater areas, the input gate capacitance becomes substantial enough to overcome any added decrease in ON resistance. Since it is desirable to minimize the device area as well as propagation times, and since there is no significant improvement in propagation delay beyond inverters of size J, a tradeoff is made by choosing size J repeaters for simulation purposes.

Figure 4:
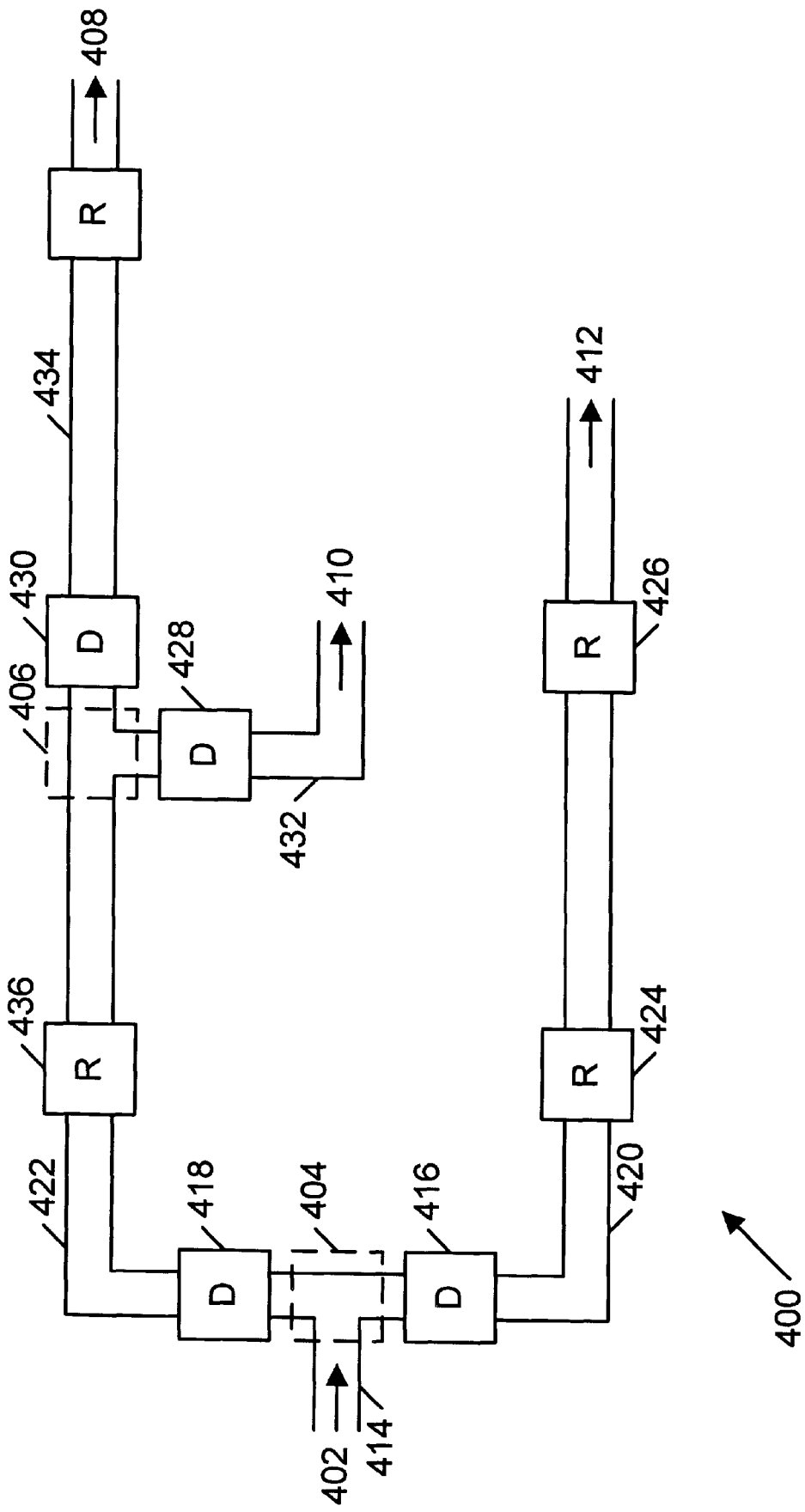
FIG. 4 illustrates an exemplary interconnect with optimized propagation delay.

Turning now to FIG. 4, an exemplary interconnect is shown with an input 402, junctions 404 and 406, and terminations 408, 410, and 412. The delay optimization method may be applied by a computer aided design (CAD) program in the following recursive manner. Follow parent interconnect 414 from input 402 until a junction or a termination is encountered. At junction 404, place drivers 416 and 418 to isolate branches 420 and 422 from parent interconnect 414. Place branches 420 and 422 in a queue. Use the formula for k to determine the optimum number of repeaters for parent interconnect 414. In this case, parent interconnect 414 is short enough that no repeaters are needed. Parent interconnect 414 is now finished. Remove branch 420 from the queue and repeat the procedure treating branch 420 as a parent interconnect. Follow branch 420 until a junction or a termination is encountered. Since no junction is found, no drivers are placed and no sub-branches exist which must be placed in the queue. The formula for k is used, and it is determined that two repeaters are needed. Repeaters are spaced so as to split branch 420 into segments of approximately equal length. Branch 420 is now finished. Remove branch 422 from the queue. Follow branch 422 until a junction or a termination is reached. At junction 406, place drivers 428 and 430 to isolate sub-branches 432 and 434 from branch 422. Place sub-branches 432 and 434 in the queue. The formula for k is used, and it is determined that one repeater is necessary. Repeater 436 is placed so as to split branch 422 into approximately two equal segments. Branch 422 is finished.

Once the sub-branches have also been processed in this manner, the placement of all the drivers and repeaters for interconnect 400 will have been determined. Interconnect 400 will then have an optimized and easily determinable propagation delay.

Figure 5:
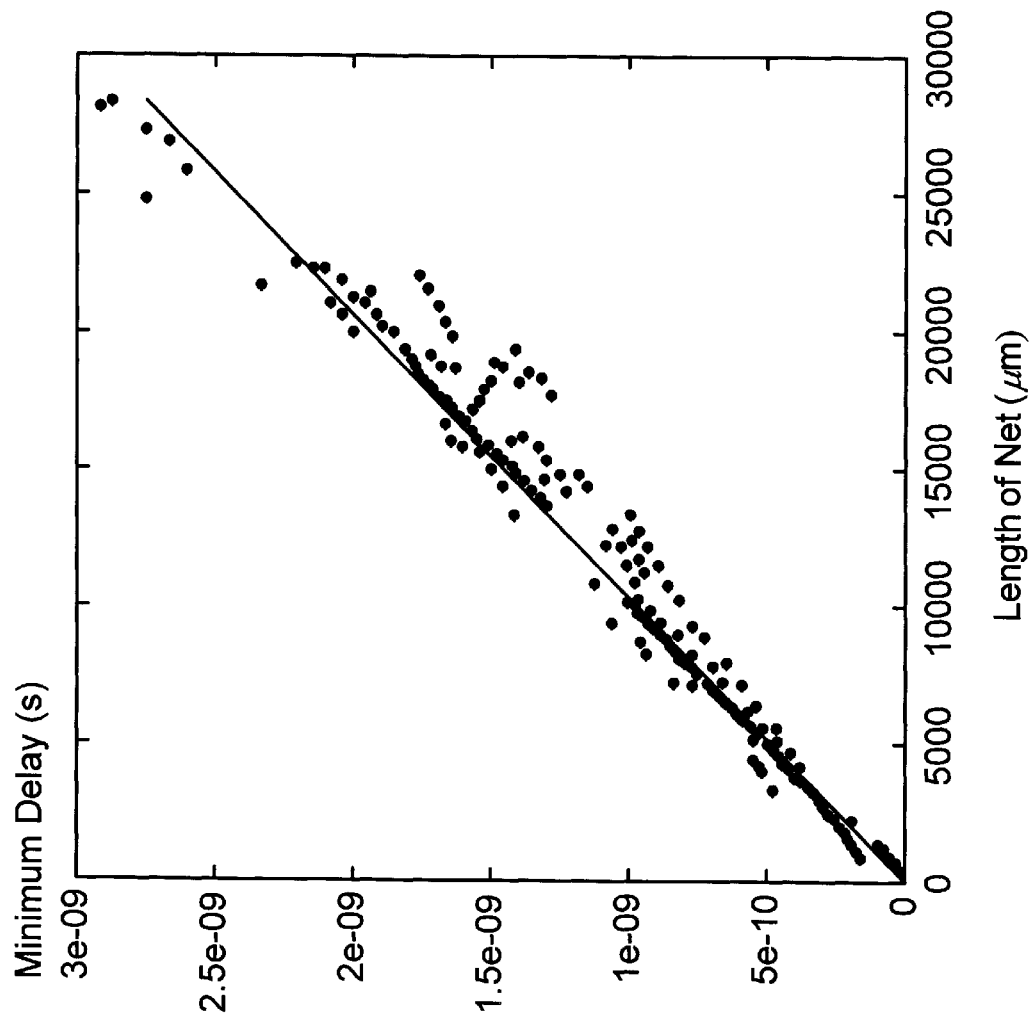
FIG. 5 is a graph depicting a linearized relationship between interconnection length and propagation delay.

Turning now to FIG. 5, a graph is shown indicating an approximately linear relationship between length of the interconnect (net) and propagation delay. Each of the points in this figure is representative of an interconnect on the floorplan on AMD's Argon microprocessor. The slope of the line is approximately 0.1 ns/1000 $\mu$m. This slope provides a convenient rule-of-thumb which may be used by designers to help estimate global interconnect timing. It should be recognized that the slope of this line is technology dependent.

Figure 6:
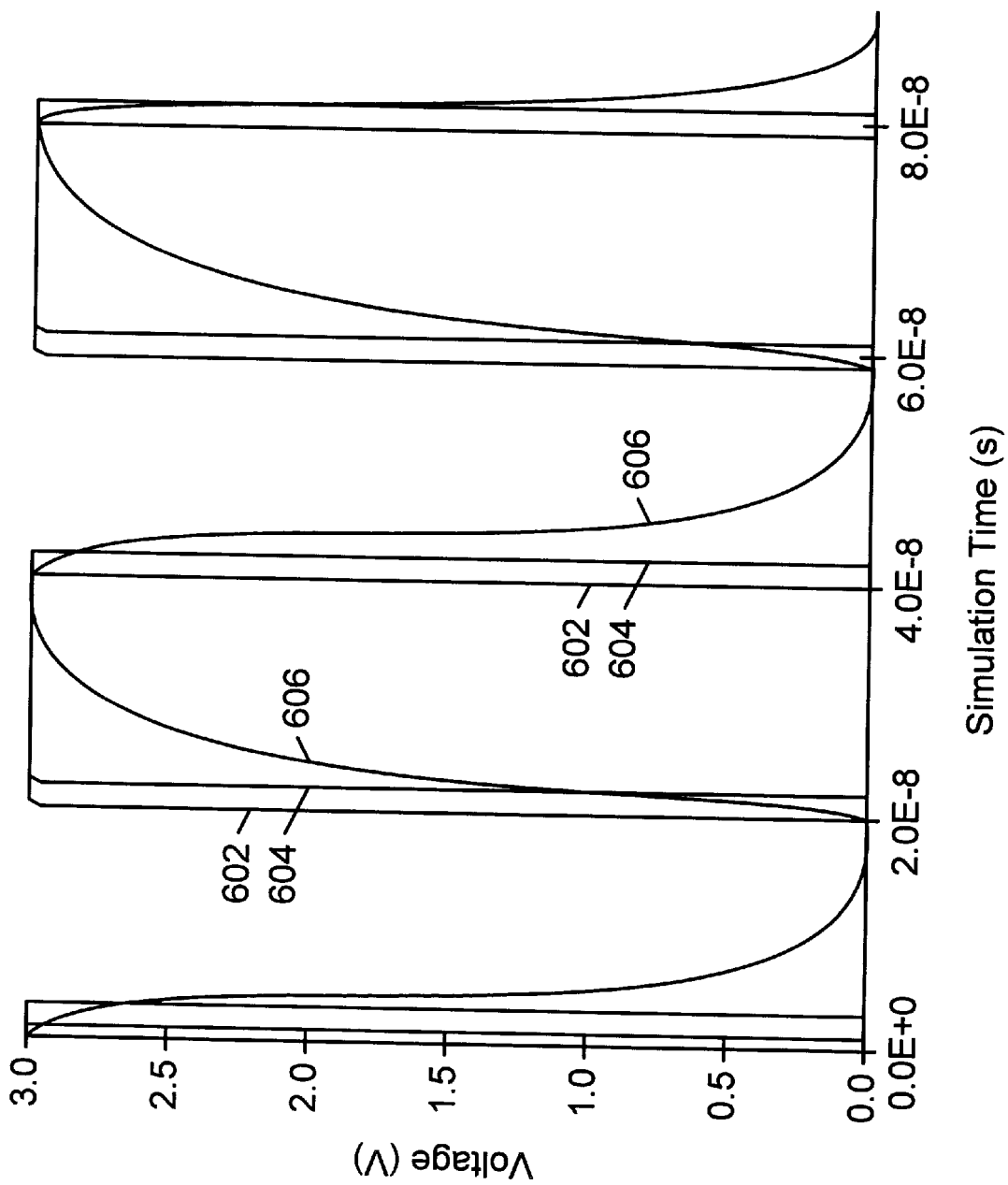
FIG. 6 is a graph depicting the propagation delay of a 2 cm interconnect with and without usage of buffering.

Turning now to FIG. 6, a graph is shown depicting the propagation delay of a 2 cm interconnect with and without usage of buffering according to the method disclosed herein. In FIG. 6, waveform 602 represents the input signal. Waveform 604 represents the simulated output signal for the interconnect with buffering according to the disclosed method. Waveform 606 represents the simulated output signal for the interconnect without buffering. Measuring from the 50% point on the waveforms, the buffered interconnect has a propagation delay of 2 ns, while the unbuffered interconnect has a propagation delay of about 7.5 ns. This represents a speedup by a factor of slightly less than 4.

Each of the interconnects represented in FIG. 5 was treated by a variant of the method disclosed herein. In this variant, a calculation is performed on each branch to determine whether the branch represents enough of a load to necessitate a driver. In the cases where the branch does not represent a significant load, a driver is not placed. Also in this variant, a lookup table based on the formula for k is used to determine the number of repeaters for an unforked branch.

Numerous other variations and modifications will become apparent to those skilled in the art once the above disclosure is fully appreciated. It is intended that the following claims be interpreted to embrace all such variations and modifications.

What is claimed is:

1. A method for decreasing propagation delay of an interconnect in an integrated circuit, said interconnect having a parent interconnect which forks into two or more branches, said two or more branches including a first branch coupled to the parent interconnect at a junction, said first branch having loading effects associated therewith, said method comprising:

identifying said first branch in said integrated circuit;

isolating said loading effects of said first branch by placing a driver in said first branch; and placing a number of repeaters, k, having an ON resistance $R_o$ and a gate capacitance $C_o$, in a branchless portion of said interconnect having a resistance $R_i$ and a capacitance $C_i$, said number of repeaters being determined according to the relation $$k = \sqrt{\frac{R_i C_i}{R_o C_o}}.$$

2. The method of claim 1 wherein said repeaters are evenly spaced.

3. An integrated circuit which includes an interconnect, said interconnect comprising:

a parent interconnect which forks into two or more branches;

said two or more branches including a first branch coupled to the parent interconnect at a junction; and a driver configured to receive an electrical signal from said parent interconnect and provide a copy of said signal to said first branch;

wherein a forkless portion of said interconnect includes a number of repeaters, k, having an ON resistance $R_o$ and a gate capacitance $C_o$, said forkless portion having a resistance $R_i$ and a capacitance $C_i$, wherein said number of repeaters is determined according to the relation $$k = \sqrt{\frac{R_i C_i}{R_o C_o}}.$$

4. The integrated circuit of claim 3, wherein said repeaters are distributed in an equidistant fashion along the length of said forkless portion.

* * * * *